United States Patent [19]

Turner et al.

[11] Patent Number: 4,724,011
[45] Date of Patent: Feb. 9, 1988

[54] SOLAR CELL INTERCONNECTION BY DISCRETE CONDUCTIVE REGIONS

[75] Inventors: Gary B. Turner, Canoga Park; Don L. Morel, Agoura Hills; Robert R. Gay, Granada Hills; Arvind Halani, Canoga Park; Dale E. Tarrant, Chatsworth, all of Calif.

[73] Assignee: Atlantic Richfield Company, Los Angeles, Calif.

[21] Appl. No.: 730,239

[22] Filed: May 3, 1985

Related U.S. Application Data

[63] Continuation-in-part of Ser. No. 495,198, May 16, 1983, Pat. No. 4,517,403.

[51] Int. Cl.[4] .................. H01L 27/14; H01L 31/18
[52] U.S. Cl. ...................... 136/249; 136/258; 29/572; 29/591; 357/30; 357/59; 219/121 LL; 437/2
[58] Field of Search ........ 136/244, 249 MS, 258 AM; 357/30, 59 C; 29/572, 580, 582, 590, 591; 219/121 LH, 121 LL, 121 LN

[56] References Cited

U.S. PATENT DOCUMENTS

| 4,042,418 | 8/1977 | Biter | 136/249 MS |
| 4,428,110 | 1/1984 | Kim | 29/572 |
| 4,517,403 | 5/1985 | Morel et al. | 136/249 MS |
| 4,532,371 | 7/1985 | Hanak et al. | 136/249 MS |
| 4,570,332 | 2/1986 | Yamauchi | 29/586 |
| 4,594,471 | 6/1986 | Yamazaki | 136/249 MS |

FOREIGN PATENT DOCUMENTS

| 2095908 | 10/1982 | United Kingdom | 136/249 MS |
| 2146173A | 4/1985 | United Kingdom | 136/249 MS |

OTHER PUBLICATIONS

W. J. Biter et al, *Conference Record, 12th IEEE Photovoltaic Specialists Conference* (1976), pp. 466-470.

*Primary Examiner*—Aaron Weisstuch
*Attorney, Agent, or Firm*—Nilsson, Robbins, Dalgarn, Berliner, Carson & Wurst

[57] ABSTRACT

Cells of a thin film solar module having opposed upper and lower electrodes are connected in series by a plurality of discrete conductive regions extending between each upper electrode and the lower electrode of an adjoining cell. In a preferred embodiment, the opposite electrodes of adjoining cells overlap one another and one of the electrodes is a transparent conductive pad with a thickened metal-containing portion to aid in interconnection. In another embodiment, the conductive regions are formed by applying laser pulses to spaced locations along the areas of electrode overlap, after which a conductor may be deposited into cavities formed by the laser pulses.

19 Claims, 4 Drawing Figures

FIG. 3

SOLAR CELL INTERCONNECTION BY DISCRETE CONDUCTIVE REGIONS

This application is a continuation-in-part of copending U.S. patent application Ser. No. 495,198, filed May 16, 1983 by Morel et al for Series Connected Solar Cells and Method of Formation now U.S. Pat. No. 4,517,403.

BACKGROUND OF THE INVENTION

The present invention relates generally to a thin film solar module and, more particularly, to a method and structure for interconnecting cells by a plurality of discrete conductive regions extending between each pair of cells to be interconnected.

Thin film solar cells generate current at voltages far below those required in most consumer applications. Thus, it is desirable to produce a large number of such cells in a single monolithic module and connect them in series so that the overall output voltage is the sum of the cell voltages. A number of prior techniques for interconnecting monolithic solar cells have made use of continous stripes of conductive material disposed along edges of the cells, as described in Kim U.S. Pat. No. 4,428,110, Biter U.S. Pat. No. 4,042,418 and Swartz British Pat. No. 2,095,908.

Another form of interconnection is disclosed in the above-identified parent application of Morel et al, which describes a primary embodiment having conductive stripes or "stitch bars" on transparent front contact pads. Unlike the stripes of the Kim, Biter and Swartz patents, the stitch bars of the Morel patent are not necessarily continuous.

The Morel technique also makes use of the localized application of heat to the area of the stitch bars to increase conductivity. If a laser of sufficiently high energy is used to apply heat, the back contact and the semiconductive layer beneath it are cut along a continuous line, leaving a conductive residue which connects the cells together. However, such a cut isolates one-half of the conductive residue from the bulk of the corresponding back contact pad, taking that portion of the residue out of the series circuit of the module.

A continous cut is also undesirable for process-related reasons because the laser used to produce it must emit pulses rapidly as the workpiece moves. This requires a rather sophisticated laser and may limit the processing speed. Finally, continuous cutting operations produce a significant amount of debris which can be a problem in cell manufacture.

Therefore, it is desirable to provide an improved method of interconnecting monolithic solar cells which is rapid, effective, and produces a minimum of debris.

SUMMARY OF THE INVENTION

The structure and method of fabricating a thin film solar module according to the present invention involve: a plurality of first electrode pads on a substrate; at least one semiconductive layer deposited onto the first electrode pads to establish a photovoltaic region corresponding to each first electrode pad; a plurality of second electrode pads deposited onto the semiconductive layer, each second electrode pad overlying one of the photovoltaic regions and overlapping the first electrode pad of an adjacent photovoltaic region over a preselected area; and a plurality of localized conductive paths through the semiconductive layer from each second electrode pad to the first electrode pad that it overlaps to connect at least two of the photovoltaic regions in series, the conductive paths comprising discrete conductive regions spaced apart from each other along a preselected course within the plane of the module.

In a preferred embodiment, the localized conductive paths are established by applying discrete, spaced-apart laser pulses to the areas of electrode overlap. The pulses render the material along the paths more conductive and may vaporize part of the second electrode pads and the semiconductive layer so that holes or cavities extend partially through the module. When cavities are created, the material around them is heated, as well. The material closest to a cavity is heated to a very high temperature and the more distant material is heated to progressively lower temperatures, so that material at some radius from the cavity is heated to temperatures within a range which causes it to become conductive. Thus, a substantially annular conductive region is produced around each cavity to interconnect the cells. In another preferred embodiment, each first electrode pad is made up of a transparent conductive film portion and a metal-containing portion in electrical contact therewith, such that the discrete conductive regions extend from each second electrode pad to the metal-containing portion of the first electrode pad that it overlaps.

The present invention relaxes processing constraints while providing a sufficiently conductive interconnecting path along the edges of cells. The speed of the workpiece relative to the laser can be increased without increasing the rate of laser pulses, permitting the laser to operate in a range within which it produces identical, well-defined pulses. When the laser removes material at discrete locations, the process yields less debris than a continuous cut. It can also produce more conductive material for interconnection because the cavities created by the laser are surrounded by substantially annular conductive regions, as opposed to a pair of opposed conductive walls. The entire circumference of each annular region is connected to the major portion of the upper contact and is useful for interconnection.

BRIEF DESCRIPTION OF THE DRAWINGS

The above and other features of the present invention may be more fully understood from the following detailed description, taken together with the accompanying drawings, wherein similar reference characters refer to similar elements throughout and in which.

DESCRIPTION OF THE PREFERRED EMBODIMENTS

Figure 1:
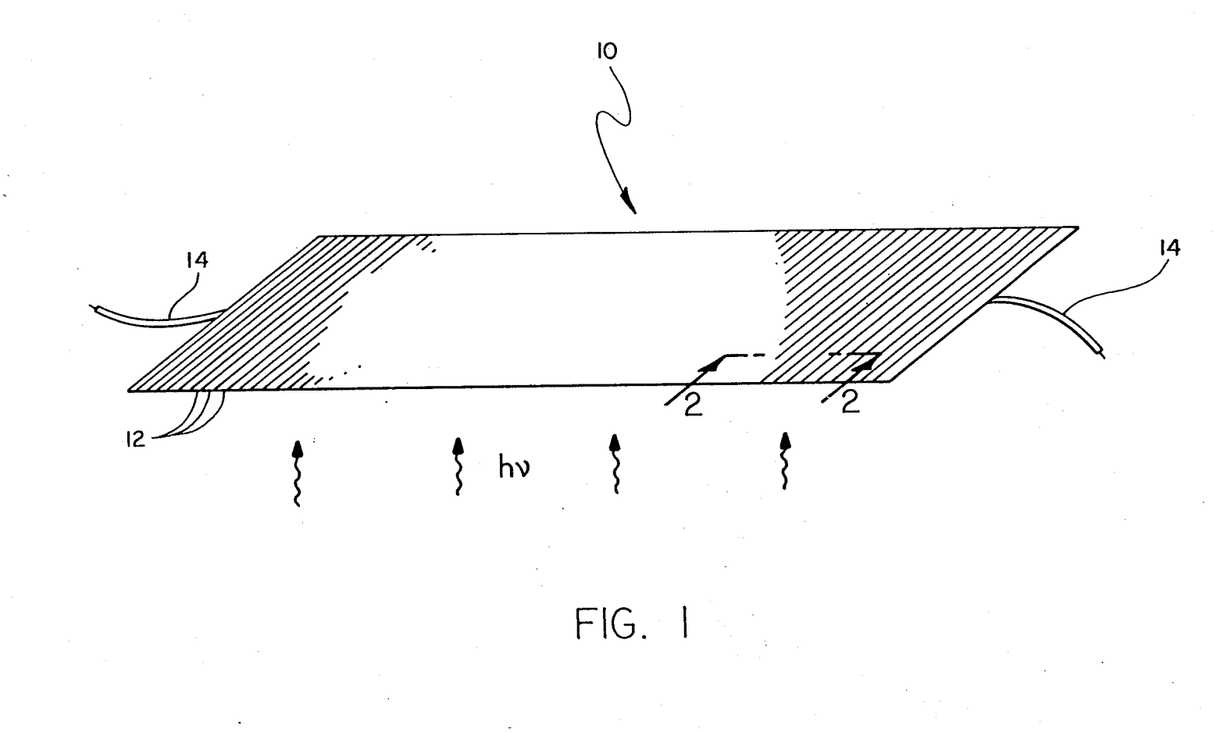
FIG. 1 is an isometric view of a monolithic solar module constructed according to a preferred embodiment of the present invention.

FIG. 1 illustrates a monolithic thin film solar module 10 constructed according to a preferred embodiment of the present invention. The module has a plurality of elongated solar cells 12 connected electrically in series between a pair of external leads 14. The cells are shaped as narrow stripes and are connected together along opposite longitudinal edges thereof to minimize series resistance losses. Connection is accomplished by a large number of discrete conductive regions extending directly through an unpatterned active layer of the module. The conductive regions can be produced by applying conductive material discontinuously near an edge of each cell before the active layer is deposited, by heating the cells to a preselected temperature at a plurality of spaced locations, by a composite method in which conductive material is applied and the cells are heated at spaced locations, or by a somewhat different method in which discrete holes or cavities are formed in the active layer and subsequently provided with conductive material. In each case, current generated by the cells in response to incident light (hv) travels a short distance along each cell electrode before passing by way of the discrete conductive regions to an opposite electrode of an adjacent cell.

Figure 2:
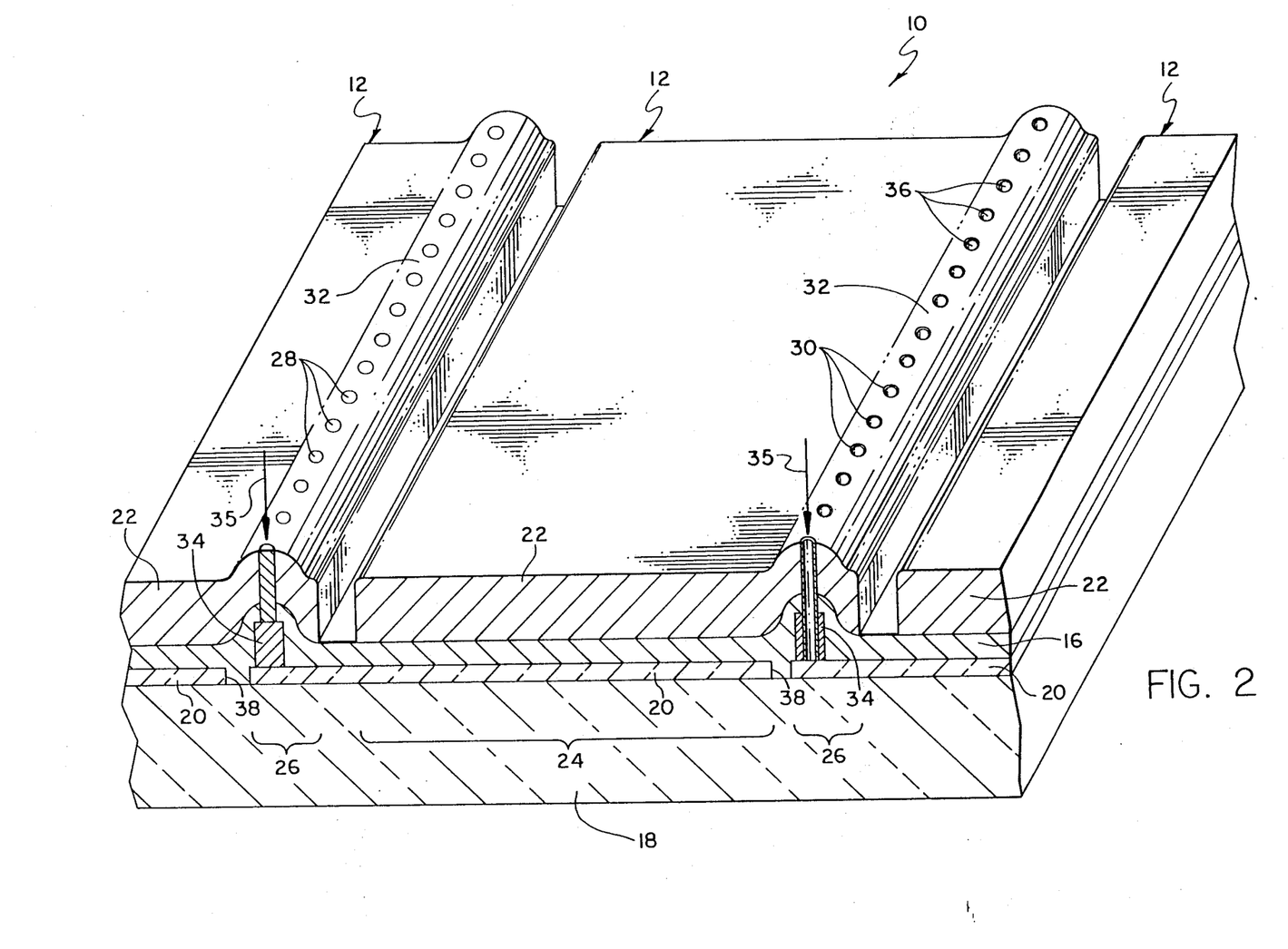
FIG. 2 is a diagrammatic enlarged isometric view of the solar module of FIG. 1, sectioned along the line 2—2 of FIG. 1.

Referring to FIG. 2, the solar panel 10 has a continuous semiconductive layer 16 on a transparent substrate 18. The semiconductive layer 16 is contacted at a lower surface thereof by a plurality of first (front) electrode pads 20 and at an upper surface by a plurality of second (back) electrode pads 22. Each back electrode pad 22 overlies a portion of one of the front electrode pads 20 at a photovoltaic region 24 of the semiconductive layer, forming one of the cells 12 of the module. Each back electrode pad 22 also overlaps the front electrode pad 20 of an adjacent cell over a preselected area 26. Interconnection is made by a plurality of discrete conductive regions 28 or 30 which extend through the semiconductive layer at locations spaced apart from each other along imaginary lines or courses 32 within the plane of the module.

In the preferred embodiment, the front electrode pads 20 are transparent conductive pads having metal-containing interconnect portion or "stitch bars" 34 at the areas of overlap. The concept and structure of the interconnect portions 34 are described in the above-referenced patent of Morel et al., the specification of which is hereby incorporated by reference. According to that disclosure, an effective short circuit is provided between each front electrode and the back electrode that overlaps it, causing the voltage at the front of each cell to be applied to the back of an adjacent cell to form at least one series-connected string of cells. In a large module, a number of series-connected strings may be connected in parallel to produce desired output voltage and current characteristics.

The interconnect portions 34 are deposited before the thin film semiconductive layer 16 and are preferably tall and rough in comparison to it, causing the semiconductive layer to have localized regions near the interconnect portions which are relatively thin and have a low dielectric standoff. The interconnect portions preferably have the same height and other characteristics as described in the patent of Morel et al; e.g., a height substantially greater than the thickness of the semiconductive layer. With an appropriate choice of materials and dimensions of the interconnect portions 34 and the back contact pads 22, the structure yields conductive regions sufficient to interconnect cells. In such a case, the interconnect portions 34 will typically be discontinuous along the courses 32 to produce the discrete conductive regions 28 or 30.

If the relative height and roughness of the interconnect portions 34 are not great enough to provide reliable connection between cells, the semiconductive layer can be rendered more conductive at the regions 28 or 30 by the local application of heat. The interconnect portions 34 may then be either continuous or discontinuous, and may be very thin as long as sufficient material is present to make contact to the front electrode pads.

A critical consideration of the module 10 is that the total conductance of the interconnects be sufficient to pass current produced by the cells without adding appreciably to series resistance. The conductance is, of course, dependent on the spacing between conductive regions. In different applications the spacing may vary from a minimum at which the conductive regions nearly touch to a maximum comparable to the width of the strip cells 12. Some of the parameters relevant to the spacing of conductive regions are the same as those determining maximum cell width, i.e., sheet resistance and general module design criteria. In most cases, the conductive regions are spaced apart between approximately 10 and 100 microns.

The local application of heat is preferably accomplished by directing laser pulses 35 onto the areas of the interconnect portions 34 at locations spaced apart sufficiently to produce discrete conductive regions approximately 25 microns in diameter. The conductive regions may be heated to a temperature which causes diffusion into or crystallization of the semiconductive layer without disrupting the integrity of the layer, or may be heated to a point at which the material vaporizes to produce a hole or cavity 36 down to the stitch bar 34.

The generally Gaussian intensity profile of laser pulses causes the material irradiated by the center of a pulse to be heated to a higher temperature than that irradiated by its fringe. As long as a pulse has at least a preselected threshold energy, the energy imparted by the laser will be just enough at some point within the module to enhance conduction without adversely affecting the properties of the material. The point of enhanced conduction can be at the center of the pulse or spaced from it, depending upon the pulse energy. When material is vaporized or otherwise removed by the laser, the surrounding material is also heated, and conductive material is dispersed through the thickness of the layers. This produces a substantially annular region of relatively high conductivity which contains both the back contact material and the semiconductive material. The conductive region can be located along the interior wall of the cavity 36 or outwardly therefrom, depending upon the energy of the laser and the materials used.

The stitch bars and the electrode pads are preferably arranged so that the point of interconnection is within the area 26 of electrode overlap and is spaced inwardly from the parallel edges of the overlapping pads. This assures reliable interconnection of cells without shorting either cell.

As described in the patent of Morel et al., the transparent substrate 18 is preferably a glass substrate coated with a thin transparent conductive layer for use as the front electrode of the cell. The glass and the transparent conductor are chosen to be compatible with one another, with the transparent conductor chosen to minimize losses due to absorption and series resistance.

The interconnect portions 34 are preferably applied as parallel lines over the transparent conductive film and the film is scribed alongside the interconnect portions to yield a series of discrete front electrode pads 20 separated by spacings 38, each electrode pad having an interconnect portion adjacent to one edge thereof. The interconnect portions 34 may be deposited by suitable thin film techniques, such as evaporation through a mask, or by screen printing. In the case of screen printing, the interconnect portions are applied as a screen printable paste containing metallic powder, glass frit, and a suitable organic vehicle or binder. The paste is subsequently cured at elevated temperatures to leave conductive material having a significant metallic content.

The semiconductive layer 16 is preferably thin film silicon:hydrogen-based material having layers of different conductivity type which form a rectifying junction. In the preferred embodiment, a p-type layer approximately 125 angstroms thick is deposited without patterning over the front electrode pads 20 and the spaces 38 between the pads, followed by an undoped (intrinsic) layer approximately 4,000 angstroms thick and an n-type layer a few hundred angstroms thick. The intrinsic layer is preferably thin film silicon:hydrogen, whereas the p and n-type layers may contain thin film silicon carbide:hydrogen.

The back electrode pads 22 are applied over the semiconductive layer 16, with the electrode pads 22 offset slightly from the pads 20 so that they overlap along the areas 26 which contain the interconnect portions 34. The back electrode may contain any suitable material able to form an ohmic contact with the n-type material of the semiconductive layer 16 and a stable, low resistance contact with the interconnect portions 34. When the module is to be heated to enhance conduction, the back contact material should also be able to combine locally with the semiconductive material or be dispersed over the thickness of the semiconductive material to provide a conductive path. If the interconnect portions 34 are screen printed silver lines and the semiconductive layer 16 is a silicon-based composition, the back electrode pads 22 may be aluminum applied by sputtering or other suitable technique. Although aluminum does not form a stable contact with transparent conductive oxides, it combines well with silicon and makes a good contact to silver.

The thicknesses of the layers of the module 10 are subject to modification but typically fall within known ranges. For example, the semiconductive layer 16 is preferably between approximately 3,000 and 6,000 angstroms in total thickness and the transparent conductor should be between approximately 500 and 10,000 angstroms thick. The thickness of the back electrode pads 22 is less critical than that of the semiconductive layer or the transparent conductive contact. It can vary upwardly from a minimum of a few hundred angstroms, as long as adequate conductivity is obtained. When the back contact is screen printed, it may be 25 microns or more in thickness.

Figure 4:
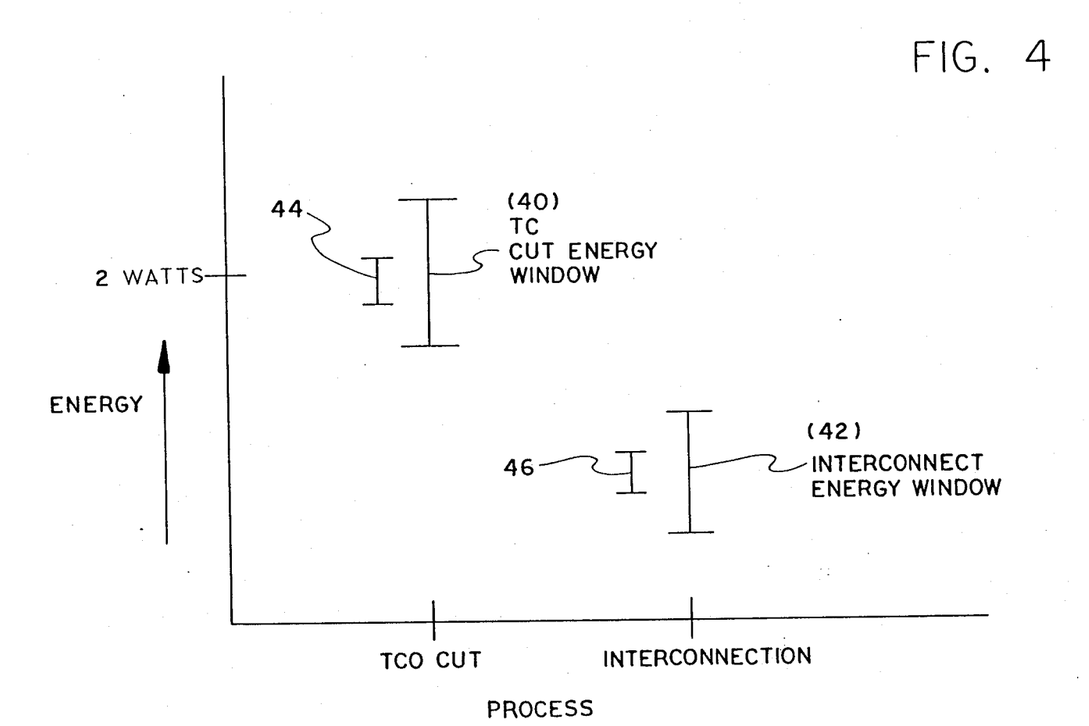
FIG. 4 is a generalized graphical representation of laser energies suitable to scribe a transparent conductive film and interconnect cells according to the present invention.

The energy of the laser used to interconnect cells typically falls within a window of suitable values lower than the energy required to pattern the transparent conductive film of the front electrode pad 20. This relationship is shown graphically in FIG. 4, wherein laser pulses having energies within the range 40 will pattern the oxide film of the front electrodes 20 without damaging the glass substrate 18, and pulses within the range 42 will produce conductive regions 28 or 30 without damaging the oxide film. The ranges 40 and 42 may be mutually exclusive, yielding different optimum energy ranges 44 and 46 for carrying out the two processes. In any case, the required laser energies and pulse repetition rates will depend on the materials and thicknesses of the layers encountered.

It will be understood from the foregoing that an important function of the interconnect portions 34 is to provide a base material for connection of the front electrode pads. The need for such a base is particularly acute when the front electrodes contain transparent conductive oxides. The base material may be a conductive metal-containing composition, as described above, or may be in the nature of a flux which is not itself conductive but acts on the transparent conductive layer to enhance the quality of the contact.

Figure 3:
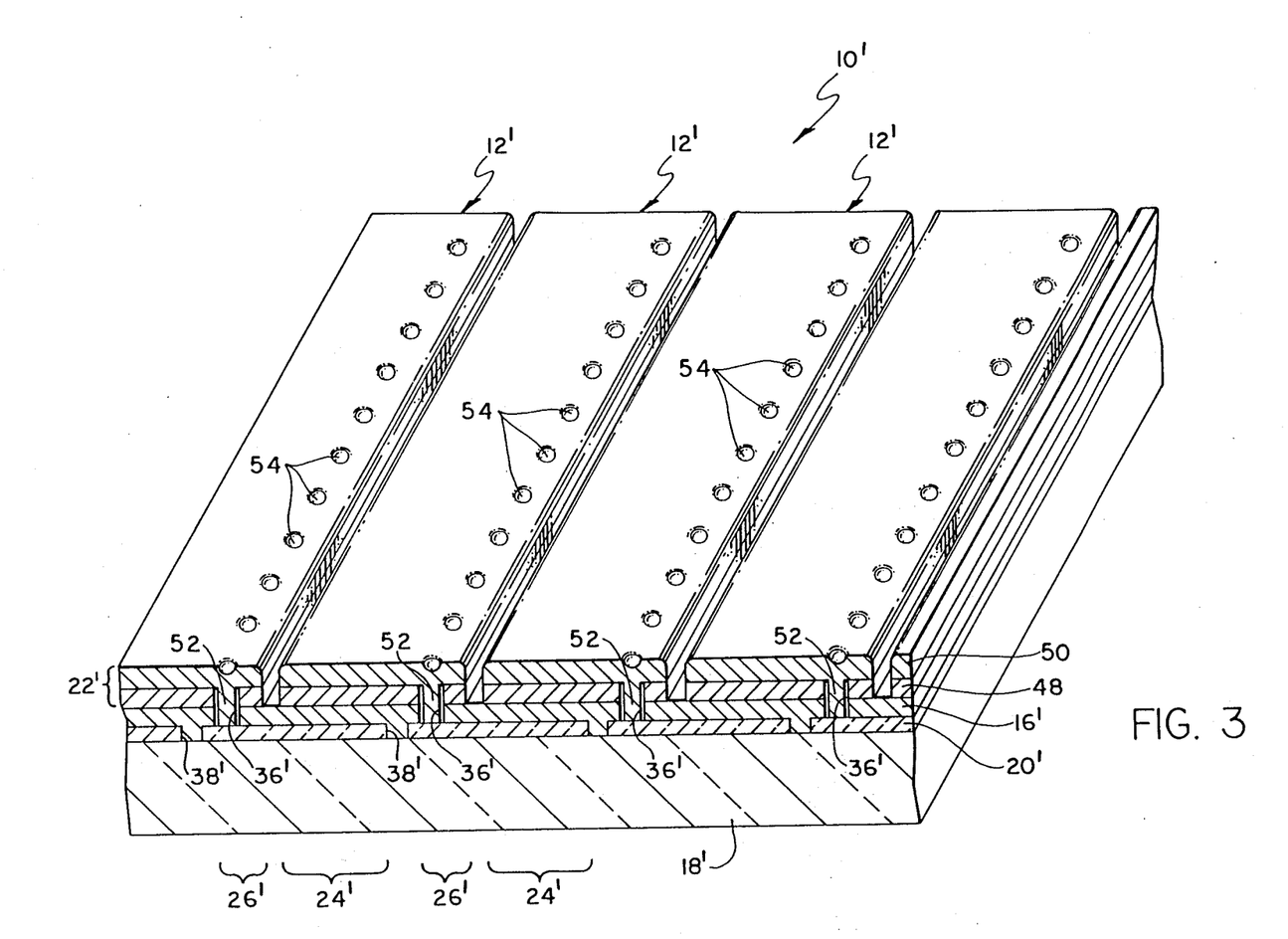
FIG. 3 is an enlarged isometric view similar to FIG. 2, of a solar module constructed according to another preferred embodiment of the invention.

FIG. 3 illustrates a solar module 10' which is constructed according to another embodiment of the present invention and does not make use of the predeposited interconnect portions 34. Photovoltaic regions 24' of a semiconductive layer 16' are sandwiched between offset front and back electrode pads 20' and 22', respectively. Specifically, the front electrode pads are deposited as a continuous layer of transparent conductive material onto a transparent substrate 18' and scribed along parallel lines to form gaps 38'. The semiconductive layer 16' is applied over the front electrode pads 20' and the substrate between the pads, and is more uniform than the corresponding layer of the module 10 because the interconnect portions 34 are not used. A conductive film 48, preferably at least a few thousand angstroms thick, is applied over the semiconductive layer 16'.

A series of holes or cavities 36' are formed in the semiconductive layer 16' and the conductive film 48 at locations near one edge of each front electrode pad, after which a second conductive film 50 is applied. The material of the film 50 covers the film 48 and enters the cavities 36' to form conductive regions 52 which connect the front electrode pads to the conductive film 48 at the locations of the cavities. As a result, the conductive film 50 has a series of depressions 54 coinciding with the cavities 36'. The conductive films 48 and 50 are patterned to separate them into the back electrode pads 22' each of which overlies a corresponding photovoltaic region 24' and is connected to the front electrode pad of an adjacent cell 12' by the conductive regions 52. In effect, the regions 52 serve as conductive "rivets" connecting the front and back electrode pads at the areas of electrode overlap.

In the module 10', the annular conductive regions resulting from the process of forming the cavities 36' are not relied upon alone for interconnection. Instead, the cavities serve primarily to provide access to the front electrode pads 20' so that subsequently applied conductive material will interconnect the cells.

Alternatively, the conductive regions 52' might be formed by introducing a plurality of separate conductive rivet-like elements through uninterrupted portions of the semiconductive layer at the areas of electrode overlap. Such a process would eliminate the need for preforming the cavities 36'.

The cavities 36' are formed by localized heating, such as laser heating with a source similar to that used to form the conductive regions 28 and 30 of the module 10 (FIG. 2). However, the considerations governing the composition of the back electrode pads 22' are different than those governing the composition of the back electrode pads of the module 10 because the material of the back electrode pads 22' must make contact directly to the transparent conductive material of the front electrode pads 20'. Whereas aluminum can be used as the back electrode of the module 10, aluminum alone is not suitable for use in the module 10' because it does not make stable contact to some transparent conductive oxides. When deposited over tin oxide, for example, aluminum forms an oxide of its own which insulates it at the point of contact. Thus, it is desirable in the embodiment of FIG. 3 to use a back electrode material which makes ohmic contact with oxides. However, such a material cannot be placed directly over the semiconductive layer 16 because it would then contact any peaks of the transparent conductive oxide which protrude through the semiconductive layer, shorting out the cells.

In the preferred embodiment of FIG. 3, the film 48 of the back electrode pads 22' contains aluminum or a similar material which makes good contact to silicon-based semiconductors, and the film 50 contains a material such as nickel, titanium, or chromium which makes good electrical contact to oxides. The first layer contacts the semiconductive layer 16' without shorting to any oxide peaks, and the second layer makes good contact to the oxide through the cavities 36'.

Although laser pulses are described above as being directed onto the backs of the modules 10 and 10' to produce the discrete conductive interconnect regions of the invention, they can be applied in the opposite direction through the transparent substrate, if desired, particularly for the module 10'. When applied in this manner, the pulses pass through the substrate and the front electrode pads before being absorbed by the semiconductive layers. The laser energy vaporizes the semiconductive material at the locations of heating, "blasting" the back electrode material off the cell to leave the cavities 36 or 36'. This geometry has the advantage that the debris produced in forming the cavities does not redeposit onto other active portions of the module. It also enables the use of lower laser powers because the energy is absorbed more efficiently by the semiconductive material (assessible from the front of the module) than it is by the metallic back electrode.

It will be understood that a variety of other heating techniques can be used to interconnect cells without deviating from the teachings of the present invention. Such techniques include the localized application of an electron beam, high voltage electric discharge, and radiant heat. In each case, heat produces discrete conductive interconnect regions which are discontinuous within each cell.

In operation, the solar panels 10 and 10' are arranged to receive light (hv) through the transparent substrate and the front electrode pads. Light absorbed by the photovoltaic material generates an electrical current for collection by the front and back electrodes of the cells. The voltage at the front electrode of each cell is applied to the back electrode of an adjacent cell by a plurality of discrete conductive regions, thereby connecting the cells in series. Thus, the voltage across the leads 14 represents the sum of the voltages of the solar cells 12.

Monolithic solar modules have been made according to both disclosed embodiments of the present invention with good results. The modules were fabricated as series-connected strip cells on substrates of glass 30 centimeters by 30 centimeters in size. The glass was purchased with a tin oxide (TO) coating having a sheet resistivity of approximately 20 ohms per square and a light transmission in the solar spectrum of about 80 percent.

In the case of the module 10, the TO layer was printed with an array of parallel stitch bars 34 using a commercial silver paste. The sample was then fired at 550 degrees Celsius, leaving continuous stitch bars approximately 25 microns high and 200 microns wide. A laser was used to scribe the TO along a line beside each stitch bar, forming groove-like spaces 38 about 25 microns wide which separated the TO layer into a plurality of front electrode pads. An additional laser scribe at the periphery of the substrate isolated the cells from any TO extending beyond a preselected area. The substrate was then subjected to a glow discharge deposition in silane to produce a p-i-n photovoltaic layer approximately 5000 angstroms thick, of the type described in the above-referenced patent of Morel et al. Finally, back electrode pads 22 were deposited by sputtering aluminum over soluble strips of a masking agent applied in a pattern corresponding to the spaces desired between pads. The masking agent and the aluminum deposited over it were removed in a subsequent step.

The conductive regions 30 were formed by directing a pulsed laser beam onto the back electrode pads at the areas of the interconnect portions 34 as the module moved. The module was moved rapidly enough so that the conductive regions were discrete from one another. The laser was a Nd-YAG laser, Q-switched, having a nominal power rating of 30 watts and a wavelength of 1.06 microns. The module was moved at approximately 8 inches per second with a pulse rate of approximately 5 kilohertz. This compares to a pulse rate of approximately 15 kilohertz for continuously scribing the transparent front contact with the same laser and at the same table speed.

Under the conditions described above, the laser produced a plurality of separate cavities 36 extending through each back electrode pad 22, the semiconductive layer 16 beneath the pad, and possibly the metallic interconnect portion 34. As the cavities were formed, annular regions around them were heated to temperatures sufficient to produce conductive combinations of the metallic and semiconductive components of the module. While not bound by any theory, it is believed that the increase in conductivity of the modules fabricated in this way resulted largely from dispersal of the metallic material of the interconnect portions 34 along the interior walls of the cavities 36. The cavities were approximately 25 microns in diameter and were spaced a few microns apart. In the context of the present invention, the cavities may be spaced anywhere from a fraction of a micron to a few centimeters apart, depending upon the conductance required for cell performance.

The modules produced according to the embodiment 10' of FIG. 3 were formed by a process similar in many respect to the process of the module 10, but different in that the interconnect portions 34 were omitted, the back electrode pads 22' were different in composition, and the cavities 36' were formed before the final conductive film 50 was applied. The first conductive film 48 of the back electrode pads 22 was a vacuum deposited aluminum layer approximately 8,000 angstroms thick which contacted the semiconductive layer 16' without shorting to peaks of the transparent conductive oxide layer. This film and the semiconductive layer 16' were subjected to a series of pulses from the laser described above to form the cavities 36' along the areas of electrode overlap. The second conductive film 50 was a vacuum deposited nickel layer at least a few thousand angstroms thick which entered the cavities 36' to produce the discrete rivet-like conductive regions 52' through the semiconductive layer. An inorganic maskant was screen printed onto the semiconductive layer 16' for patterning purposes prior to the conductive films 48 and 50. The maskant and the back electrode material over it was later removed by a solvent wash step, leaving a well-defined set of back electrode pads.

From the above, it can be seen that there has been provided a photovoltaic device and related method of formation wherein a plurality of cells of a monolithic thin film solar panel are connected in series through a plurality of discrete conductive regions extending through the photoactive film. The discontinuous nature of the conductive regions within each cell relaxes certain constraints, such as minimum laser pulse rate, and permits greater processing rates for a given laser. Each conductive region need not be perfect, as long as the aggregate of all such regions provides the necessary conductance between cells. When material is removed in this manner, the amount of debris is less than in the continuous scribing case because less material is removed. The annular conductive areas of the interconnecting "dots" can also be greater than the area provided by a single scribed line.

While certain specific embodiments of the present invention have been disclosed as typical, the invention is of course not limited to these particular forms, but rather is applicable broadly to all variations falling within the scope of the appended claims. For instance, although the modules 10 and 10' are deposited using the transparent sheet 18 as a substrate, they can be deposited equally well on an opaque substrate so that light enters the module through an upper transparent surface.

What is claimed is:

1. A thin film solar module comprising:
   a plurality of first electrode pads on a substrate, each first electrode pad comprising a conductive metal oxide film and a metallic portion in electrical contact therewith;
   at least one semiconductive layer deposited over the first electrode pads to establish a photovoltaic region corresponding to each first electrode pad;
   a plurality of second electrode pads deposited onto the semiconductive layer, each second electrode pad overlying one of the photovoltaic regions and overlapping the first electrode pad of an adjacent photovoltaic region over a preselected area which includes the metallic portion of said first electrode pad; and
   a plurality of localized conductive paths extending through the semiconductive layer from each second electrode pad to the metallic portion of the first electrode pad that it overlaps to connect at least two of the photovoltaic regions in series, the conductive paths comprising discrete conductive regions spaced apart from each other within the plane of the module.

2. The solar module of claim 1 wherein:
   the substrate and the conductive film of the first electrode pads are transparent; and
   the metallic portions comprise thickened metal-containing regions of the first electrode pads.

3. The solar module of claim 1 wherein:
   each metallic portion is a stripe which is discontinuous within the plane of the module to provide a plurality of said discrete conductive regions.

4. A method of fabricating a thin film solar module, comprising:
   providing a plurality of first electrode pads on a substrate by depositing a conductive film on the substrate, depositing a thickened metal-containing portion in electrical contact with the conductive film and patterning the conductive film;
   depositing at least one semiconductive layer onto the first electrode pads to define a photovoltaic region corresponding to each first electrode pad;
   depositing a plurality of second electrode pads onto the semiconductor layer, each second electrode pad overlying one of the photovoltaic regions and overlapping the first electrode pad of an adjacent photovoltaic region over a preselected area which includes the thickened metal-containing portion of said first electrode pad; and
   establishing a plurality of localized conductive paths through the semiconductive layer from each second electrode pad to the thickened metal-containing portion of the first electrode pad that it overlaps to connect at least two of the photovoltaic regions in series, the conductive paths comprising discrete conductive regions spaced apart from each other within the plane of the module.

5. The method of claim 4 wherein:
   each thickened metal-containing portion is formed as a discontinuous stripe to provide a plurality of said localized conductive paths.

6. A method of fabricating a thin film solar module comprising:
   providing a plurality of first electrode pads on a substrate, each of said first electrode pads having a thin film portion and a thickened metal-containing portion adjacent to an edge of the thin film portion;
   depositing at least one semiconductive layer onto the first electrode pads to define a photovoltaic region corresponding to each first electrode pad;
   depositing a plurality of second electrode pads onto the semiconductor layer, each second electrode pad overlying one of the photovoltaic regions and overlapping the first electrode pad of an adjacent photovoltaic region over a preselected area containing the respective metal-containing portion; and
   applying laser pulses to the areas of electrode overlap at the locations of the metal-containing portions to establish a plurality of localized conductive paths from each second electrode pad to the metal-containing portion of the first electrode pad that it overlaps and thus connect at least two of the photovoltaic regions in series, the conductive paths comprising discrete conductive regions spaced apart from each other within the plane of the module.

7. The method of claim 6 wherein:
   one laser pulse is applied to form each of the discrete conductive regions.

8. The method of claim 7 wherein:
   the pulses vaporize the second electrode pad and the semiconductor layer to produce cavities extending through the semiconductor layer to the first electrode pads and substantially annular conductive regions surrounding said cavities.

9. The method of claim 6 wherein:
   the thickened metal-containing portions are deposited to a thickness substantially greater than the thickness of the semiconductive layer.

10. A method of fabricating a thin film solar module comprising:
    providing a plurality of front electrode pads on a substrate;

depositing at least one semiconductive layer onto the front electrode pads to define a photovoltaic region corresponding to each front electrode pad;

depositing over the semiconductive layer a first conductive film of a first conductive material which tends not to form a stable ohmic contact with the front electrode pads;

producing a plurality of discrete cavities through the first conductive film and the photovoltaic regions of the semiconductive layer to each front electrode pad, the cavities being located adjacent to edges of the photovoltaic regions at preselected areas over which the photovoltaic regions are to be interconnected;

depositing a second conductive material over the semiconductive layer and into the cavities to form a second conductive film and a plurality of discrete conductive regions within the cavities, the second conductive material being selected to form a stable ohmic contact with the first conductive film and the front electrode pads; and patterning the first and second conductive films into a plurality of back electrode pads so that each back electrode pad overlies on of the photovoltaic regions and overlaps the front electrode pad of an adjacent photovoltaic region over said preselected area.

11. The method of claim 10 wherein:
the front electrode pads contain a transparent conductive material;
the semiconductive layer contains thin film silicon: hydrogen-based material;
the first conductive film contains aluminum; and
the second conductive film is formed of a material which makes substantially ohmic contact to the silicon:hydrogen-based material.

12. The method of claim 11 wherein:
the second conductive film contains a material chosen from the group including nickel, titanium, and chromium.

13. A thin film solar module comprising:
a plurality of first electrode pads on a substrate, each first electrode pad comprising a conductive film and a thickened metal-containing portion in electrical contact therewith;
at least one semiconductive layer deposited over the first electrode pads to establish a photovoltaic region corresopondong to each first electrode pad;
a plurality of second electrode pads deposited onto the semiconductive layer, each second electrode pad overlying one of the photovoltaic regions and overlapping the first electrode pad of an adjacent photovoltaic region over a preselected area which includes the thickened metal-containing portion of said first electrode pad; and
a plurality of localized conductive paths extending through the semiconductive layer from each second electrode pad to the metal-containing portion of the first electrode pad that it overlaps to connect at least two of the photovoltaic regions in series, the conductive paths comprising discrete conductive regions spaced apart from each other within the plane of the module and formed by localized heating of the module at a plurality of spaced locations within the areas of electrode overlap.

14. The solar module of claim 13 wherein:
the discrete conductive paths are produced by laser heating of the second electrode pads, the semiconductive layer, and the metal-containing portions of the first electrode pads, at locations within the areas of electrode overlap.

15. The solar module of claim 13 wherein:
the semiconductive layer defines a plurality of discrete cavities; and
each discrete conductive region comprises a substantially annular region which surrounds one of the cavities.

16. The module of claim 13 wherein:
the metal-containing portions are substantially thicker than the semiconductive layer.

17. A thin film solar module comprising:
a plurality of front electrode pads on a substrate;
at least one semiconductive layer deposited over the front electrode pads to define a photovoltaic region corresponding to each front electrode pad;
a plurality of back electrode pads deposited onto the semiconductor layer, each back electrode pad having a first conductive film portion overlying one of the photovoltaic regions and overlapping the front electrode pad of an adjacent photovoltaic region over a preselected area containing the respective metal-containing portion, said first conductive film portion being of a first conductive material which tends not to form a stable ohmic contact with the front electrode pads;
a plurality of discrete cavities through the first conductive film and the photovoltaic regions extending to each front electrode pad, the cavities being located adjacent to edges of the photovoltaic regions at preselected areas over which the photovoltaic regions are to be interconnected;
the back electrode pads further comprising a layer of a second conductive material deposited over the first conductive film and into the cavities to form a second conductive film and a plurality of discrete conductive regions connecting each back electrode pad to the front electrode pad that it overlaps, the second conductive material being selected to form a stable ohmic contact with the first conductive film and the front electrode pads.

18. The module of claim 17 wherein:
the front electrode pads contain a transparent conductive material;
the semiconductive layer contains a thin film silicon: hydrogen-based material; and
the first conductive material contains aluminum.

19. The module of claim 18 wherein:
the second conductive material contains a material chosen from the group including nickel, titanium, and chromium.

* * * * *